United States Patent [19]

Yamada

[11] Patent Number: 4,808,998
[45] Date of Patent: Feb. 28, 1989

[54] DISTORTION REDUCTION CIRCUIT FOR A D/A CONVERTER

[75] Inventor: Yuji Yamada, Mitaka, Japan

[73] Assignee: Kabushiki Kaisha Kenwood, Tokyo, Japan

[21] Appl. No.: 90,544

[22] Filed: Aug. 28, 1987

[30] Foreign Application Priority Data

Sep. 4, 1986 [JP] Japan ............... 61-134852[U]

[51] Int. Cl.$^4$ .............................................. H03M 1/00
[52] U.S. Cl. ..................................... 341/118; 341/144
[58] Field of Search .................. 340/347 CC, 347 DA

[56] References Cited

U.S. PATENT DOCUMENTS

| 4,323,885 | 4/1982 | Carriere | 340/347 CC |
| 4,340,882 | 7/1982 | Maio | 340/347 DA |
| 4,342,983 | 8/1982 | Weigand | 340/347 DA |

FOREIGN PATENT DOCUMENTS 0037365  4/1978  Japan ............... 340/347 CC

Primary Examiner—William M. Shoop, Jr.
Assistant Examiner—Helen Goh
Attorney, Agent, or Firm—Gerald J. Ferguson, Jr.

[57] ABSTRACT

A distortion reduction circuit for a digital to analog converter, comprising a bit detection circuit for detecting the logic value of any bit from input data thereto, a synchronizing circuit for synchronizing the output from the bit detection circuit with the analog output from the converter, and an adding and subtracting circuit for converting the value of an output voltage from the synchronizing circuit to a direct current voltage having any level. The output from the adding and subtracting circuit is arranged to be added to the analog output from the digital to analog converter.

3 Claims, 4 Drawing Sheets

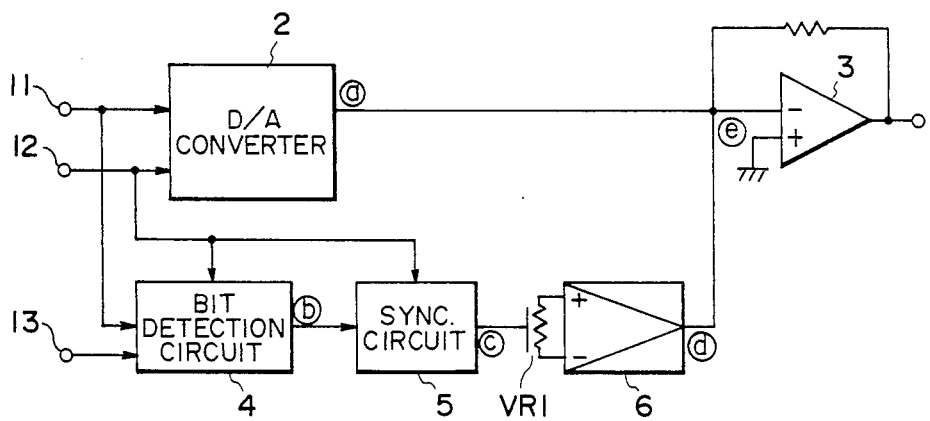
F I G. 2

DISTORTION REDUCTION CIRCUIT FOR A D/A CONVERTER

BACKGROUND OF THE INVENTION

1. Field of the Invention

The present invention relates to a D/A converter, and more particularly to a distortion reduction circuit which compensates or corrects an error in the D/A converter.

2. Description of the Prior Art

A high precision D/A converter is used in a compact disc player of high performance. When 16-bit digital data is applied to the D/A converter and the preciseness corresponding to one half of the minimum current source is required to be kept over the whole of the bits, an error in the MSB (Most Significant Bit) of the data must be less than $1/65.536 \times \frac{1}{2} \times 100 = 0.00075\%$. A current source for an actual D/A converter comprises a standard voltage source, a resistance network, and semiconductor device switches. Since the current value is determined by the resistance value, an error in the resistance value must be less than 0.00075% to maintain an error in the MSB of the input data within $\pm\frac{1}{2}$ of the LSB (Least Significant Bit) of the data. It, however, is very difficult to maintain this precision even if laser trimming on the resistance network may be used. Accordingly, a technique to compensate an error in the resistance value by means of external correction circuit has been adopted. One prior art example of such external correction circuit as a distortion reduction circuit for a D/A converter is illustrated in FIG. 1 and also disclosed in *Radio Technology* by S. Watanabe et al., November, 1985, p.p. 80-84.

In a distortion reduction circuit for a D/A converter 2 shown in FIG. 1, an input line for any bit of parallel input data signal applied to a data, input terminal of the converter 2 branches into two routes 1 and 2 . One route 1 is connected to a terminal "a" of a switch S via a transistor inverter Q1 while the other route 2 is connected to a terminal "c" of the switch S. The switch S is switched in accordnace with the magnitude of deviation, from an ideal value, of a weighted quantity for any particular bit of the input data to output a selected one from the common terminal "b". The selected signal from the terminal b is adjusted by a variable resistor VR1 to an optimal value, and then added to the analog output from the D/A converter 2 at one end of an operational amplifier 3.

In conventional distortion reduction circuits, of the type mentioned above, for D/A converters, however, the polarities of errors in the output levels of the converters corresponding to the detected bits vary depending upon their corresponding converters, so that their switches S must be switched in advance in accordance with their polarities of errors in the output levels from the D/A converters, which is troublesome from the standpoint of operation.

A rise in each input data bit is a rise in the distortion correction signal, so that the actual analog output may not be synchronized with a corrected signal output in which case improvement to distortion in a high frequency area will be reduced.

SUMMARY OF THE INVENTION

This invention has been made in view of the above problems. It is an object of this invention to provide a distortion reduction circuit for a D/A converter which eliminates the drawbacks with the prior art.

According to this invention, there is provided a distortion reduction circuit for a digital to analog converter, comprising a bit detection circuit for detecting the logic value of any bit from input data thereto; a synchronizing circuit for synchronizing the output from the bit detection circuit with the analog output from the converter; and an adding and subtracting circuit for converting the value of an output voltage from the synchronizing circuit to a direct current voltage having any level; the output from the adding and subtracting circuit being arranged to be added to the analog output from the digital to analog converter.

The bit detection circuit outputs the logic value of any data bit to the synchronizing circuit in accordance with an input bit clock and a latch signal. The output signal is synchronized by the latch signal with the analog output from the D/A converter. Thus the output distortion correction signal is output synchronously with the output from the D/A converter.

Adjustment of a quantity of correction is performed by changing the difference between input levels to the adding and subtracting circuit without the need for switching a switch in accordance with the polarity of a deviation, from an ideal value, of a weighted quantity for a detection bit.

BRIEF DESCRIPTION OF THE DRAWINGS

FIG. 2 is a block diagram of an embodiment of a distortion reduction circuit to this invention for a D/A converter to this invention;

FIGS. 5A–5F are timing charts for the output waveforms from the components of the circuit of FIG. 4.

DESCRIPTION OF THE PREFERRED EMBODIMENT

Figure 1:
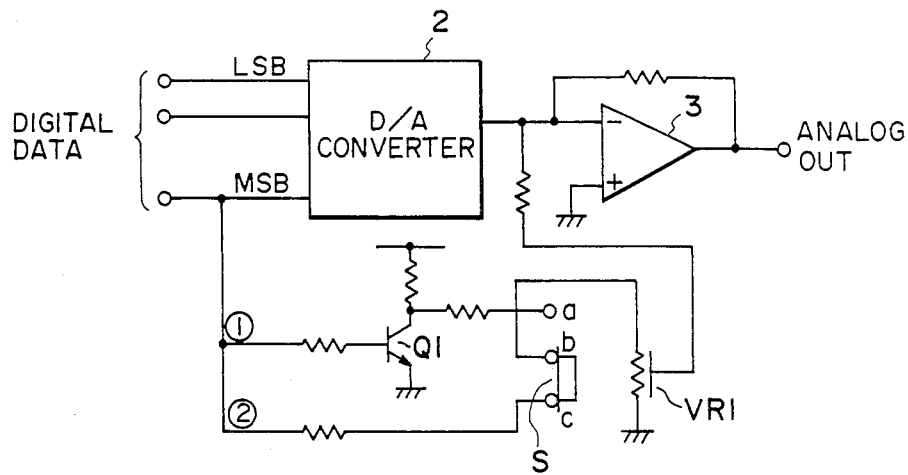
FIG. 1 shows the structure of a conventional distortion reduction circuit for a D/A converter.
Figures 3A, 3B:
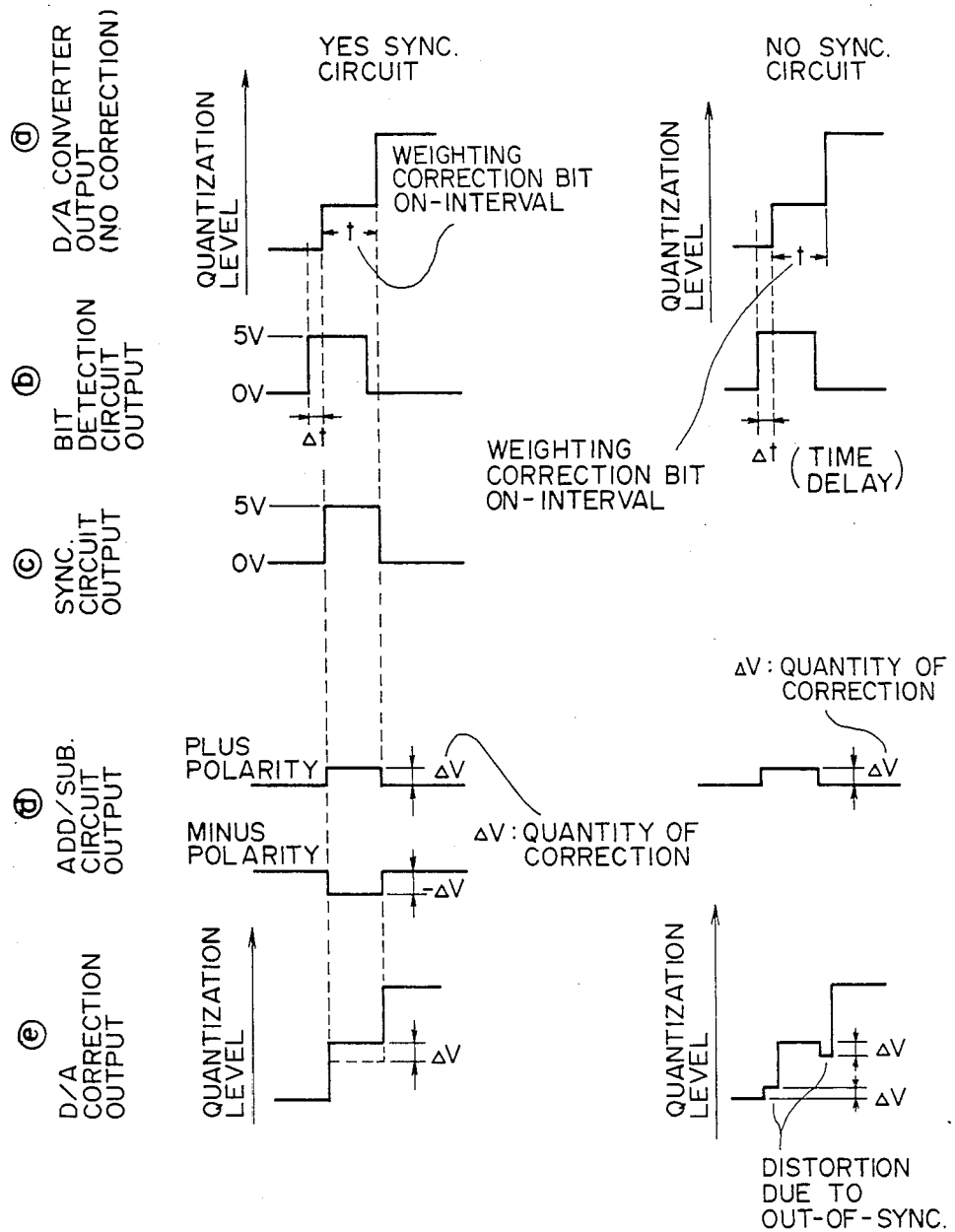
FIG. 3A is a waveform diagram for explaining the operation of the circuit of FIG. 2.
FIG. 3B is a waveform diagram for explaining a problem occurring when the synchronizing circuit of FIG. 2 is not used, in order to indicate the effect of the synchronizing circuit.

An embodiment of this invention will now be described with reference to FIGS. 2 and 3A. FIG. 2 is a block diagram showing the entire structure. FIG. 3A is a characteristic diagram showing the respective output waveforms from the circuit sections of the embodiment.

In FIGS. 2 and 3A, serial data input to a serial data input terminal 11 is input to a D/A converter 3 and a bit detection circuit 4. The bit detection circuit 4 outputs to a synchronizing circuit 5 the logic value of any data bit as an output signal b in accordance with a bit clock input to a bit clock input terminal 13 and a latch signal input to a data latch signal input terminal 12. The output signal b and the latch signal from the input terminal 12 causes the synchronizing circuit 5 to output to an adding and subtracting circuit a signal c synchronous with the analog output signal a from the D/A converter 2. The output signal c from the synchronizing circuit is adjusted by a variable resistor VR1 in accordance with the magnitude of a deviation from the ideal weighted quantity for the detected bit to thereby cause the adding and subtracting circuit 6 to output a distortion correction signal d of an appropriate distortion correction voltage ΔV (or −ΔV). The distortion correction signal from the adding and subtracting circuit 6 is added to an analog output signal a from the D/A converter 2.

FIGS. 3A and 3B show the relationship between the analog output signal a and the distortion correction signal d. FIG. 3A shows the relationship obtained when the synchronizing circuit 5 is provided while FIG. 3B shows the relationship obtained when the synchronizing circuit 5 is not provided. In FIGS. 3A and 3B, a time delay Δt means the time duration from determination of the value of a bit (0 or 1) to be compensated to the outputting of an analog signal obtained by D/A conversion. It does not depend on the signal frequency, so that especially in a high frequency signal, a reduction of the improvement to a distortion due to a time delay Δt is noticeable. However, it is ensured that the analog output signal a is synchronized with the distortion correction signal d, so that distortion in a high frequency area is improved.

The distortion reduction circuit according to this invention for a D/A converter is capable of outputting a distortion correction signal synchronous with the output from the D/A converter, so that appropriate distortion correction is possible over a wide zone. In addition, adjustment of a correction quantity is performed by changing the difference between input levels to the adding and subtracting circuit and, at the same time, the polarity of a deviation, from an ideal value, of a weighted quantity for the detected bit is changed. Therefore, no switch need be switched to thereby achieve easy adjustment.

Figure 4:
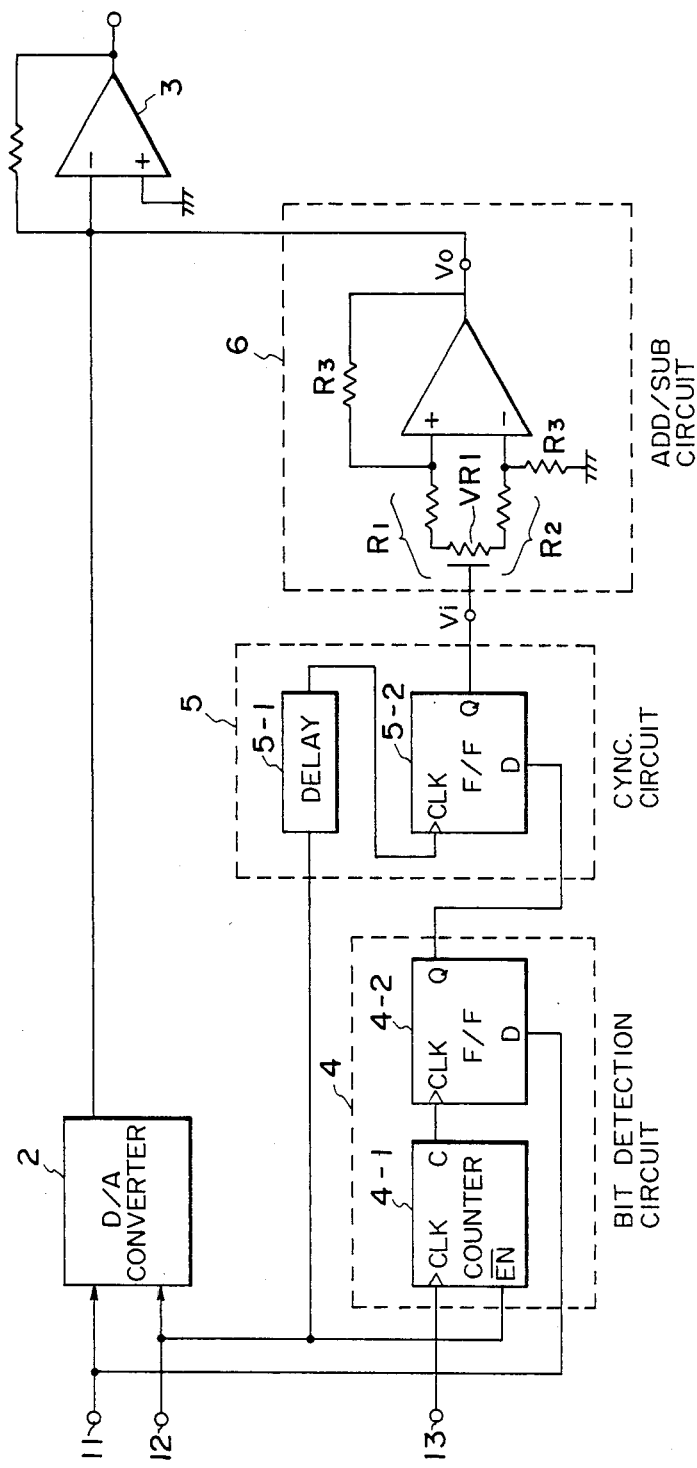
FIG. 4 illustrates an example of a circuit structure more detailed than the block diagram of the circuit of FIG. 2.

FIG. 4 shows the more details of the bit detection circuit 4, synchronizing circuit 5 and adding and subtracting circuit 6 shown in block in FIG. 2. FIGS. 5A–5F show a timing chart for the output waveforms from these blocks. Then the latch signal of FIG. 5C input from the terminal 12 to a counter 4-1 changes from high to low, a clock pulse, in FIG. 5A, from the terminal 13 causes the counter 4-1 to start its counting. The output from the counter 4-1 is shown in FIG. 5D. When the counter 4-1 has received a particular bit, here, the LSB (Least Significant Bit) (15th bit), of the serial data of FIG. 5B from the terminal 11, it is arranged to output a carry signal to latch the bit. The carry signal, shown in FIG. 5D, from the counter 4-1 is input to a D flip-flop 4-2 to latch the LSB (15th bit) of the serial data to thereby output a data signal, shown in FIG. 5E, as a Q output to the D input of the D flip-flop 5-2 of the synchronizing circuit 5. On the other hand, the latch signal delayed by a time t by a delay circuit 5-1 is applied to the CLK input of the D flip-flop 5-2. When the delayed latch signal changes from high to low, the data signal of FIG. 5E to the D input of the flip-flop 5-2 is latched to thereby output to its Q output a data signal shown in FIG. 5F. The data signal of FIG. 5F is the latched signal of the LSB (15th bit) of the Δt-delayed serial data. The latched signal is input to the adding and subtracting circuit 6 to become a distortion correction signal. When the output from the D/A converter 2 is output delayed by t from the time when the latch signal changed from high to low, the output from the D/A converter 2 and the distortion correction signal are added synchronously at the operational amplifier 3. If the conversion time at the D/A converter 2 is negligible, the delay circuit 5-1 will be omitted.

If the input voltage to the adding and subtracting circuit 6 is Vi, and the output voltage is Vo, the relationship Vo=(R3 (R1−R2)/R1 (R2+R3))Vi holds. If VR1 is changed, (i) when R1 =R2, Vo will be 0 in which case no correction signal is output;

(ii) when R1>R2, Vo will be plus in which case the polarity of the correction signal is positive; and (iii) when R1<R2, Vo will be minus in which case the polarity of the correction signal is negative.

Therefore, by changing the VR1, the polarities of errors in the output levels from D/A converters such as 6 and correction signal levels therefor can be changed continuously depending on the individual natures of the errors.

What is claimed is:

1. A digital-analog converter with a correction function of converting an input digital signal sequence of words to an output analog signal, each word having a plurality of bits, the converter comprising:

digital-analog converting means for converting each word of the input digital signal sequence to analog signal;

correction signal generating means comprising (a) means for detecting a bit at a predetermined bit position in each word of the input digital signal sequence and generating a bit signal upon the detection of bit, (b) means in response to the bit signal for generating a correction signal; and means for combining the analog signal from said digital-analog converting means with the correction signal from said correction signal generating means to produce the output analog signal, wherein said correction signal generating means further comprises means for synchronizing the correction signal with the analog signal at said combining means.

2. A digital-analog converter according to claim 1, wherein said synchronizing means is a circuit for delaying the bit signal by a conversion delay time in said digital-analog converting means.

3. A digital-analog converter according to claim 1, wherein the bits in each word of the input digital signal sequence are serially applied to said digital-analog converting means.

* * * * *